United States Patent
Garcia Redondo et al.

(10) Patent No.: US 11,841,397 B2
(45) Date of Patent: Dec. 12, 2023

(54) SYSTEM-ON-A-CHIP TESTING FOR ENERGY HARVESTING DEVICES

(71) Applicant: Arm Limited, Cambridge (GB)

(72) Inventors: Fernando Garcia Redondo, Cambridge (GB); James Edward Myers, Bottisham (GB); Parameshwarappa Anand Kumar Savanth, Cambridge (GB); Pranay Prabhat, Cambridge (GB); Gary Dale Carpenter, Austin, TX (US)

(73) Assignee: Arm Limited, Cambridge (GB)

( * ) Notice: Subject to any disclaimer, the term of this patent is extended or adjusted under 35 U.S.C. 154(b) by 107 days.

(21) Appl. No.: 17/363,809

(22) Filed: Jun. 30, 2021

(65) Prior Publication Data

US 2023/0003795 A1    Jan. 5, 2023

(51) Int. Cl.
*G01R 31/317* (2006.01)
*G06F 9/4401* (2018.01)

(52) U.S. Cl.
CPC .  *G01R 31/31724* (2013.01); *G01R 31/31721* (2013.01); *G06F 9/4418* (2013.01)

(58) Field of Classification Search
CPC ........ G01R 31/31721; G01R 31/31724; G01R 31/28; G01R 31/2801; G01R 31/2803; G01R 31/2818; G01R 31/26; G01R 31/2601; G01R 31/2607; G01R 31/302; G01R 31/3025; G01R 31/303; G01R 31/304; G06F 9/4418
See application file for complete search history.

(56) References Cited

U.S. PATENT DOCUMENTS

| | | | | |
|---|---|---|---|---|
| 5,377,200 A | * | 12/1994 | Pedneau | G01R 31/31701 713/324 |
| 6,294,997 B1 | * | 9/2001 | Paratore | G06K 19/0723 340/540 |
| 7,181,663 B2 | * | 2/2007 | Hildebrant | G01R 31/31905 714/30 |
| 7,669,094 B2 | * | 2/2010 | Dembo | G01R 31/31723 714/733 |
| 8,035,521 B2 | * | 10/2011 | Lees | H04L 9/0819 235/377 |
| 8,140,009 B2 | * | 3/2012 | Brandl | G01R 31/3025 455/67.11 |
| 8,400,278 B2 | * | 3/2013 | Koyama | G06K 19/0702 340/10.2 |

(Continued)

FOREIGN PATENT DOCUMENTS

CA    3051219 A1  *  2/2020  ............. G06F 1/163

OTHER PUBLICATIONS

Colin, et al., "An Energy-interference-free Hardware-Software Debugger for Intermittent Energy-harvesting Systems," ASPLOS 2016, Apr. 2, 2006-Apr. 6, 2016, DOI: http://dx.doi.org/10.1145/2872362.2872409, 13 pages.

(Continued)

*Primary Examiner* — Judy Nguyen
*Assistant Examiner* — James Split
(74) *Attorney, Agent, or Firm* — Berkeley Law & Technology Group, LLP

(57) ABSTRACT

Subject matter disclosed herein may relate to wireless energy harvesting devices and may relate more particularly to system-on-a-chip testing for wireless energy harvesting devices.

15 Claims, 8 Drawing Sheets

(56) References Cited

U.S. PATENT DOCUMENTS

| | | | | |
|---|---|---|---|---|
| 9,823,296 | B2* | 11/2017 | Thanner | G01R 31/31701 |
| 10,192,078 | B2* | 1/2019 | Ren | G01R 31/31721 |
| 11,126,256 | B1* | 9/2021 | Gruber | G06F 1/3293 |
| 2016/0320445 | A1* | 11/2016 | Lin | G01R 31/3187 |
| 2019/0033367 | A1* | 1/2019 | Pappu | G06F 11/27 |

OTHER PUBLICATIONS

Lee, "Energy Harvesting Chip and the Chip Based Power Supply Development for a Wireless Sensor Network," Open Access Sensors, ISSN 1424-8220, www.mdpi.com/journal/sensors, 7690-7714; DOI: 10.3390/s8127690, published Dec. 2, 2008, 25 pages.

Kristjánsson, et al., "Test System to Evaluate Energy-Harvesting Technologies for Wireless Sensors," Department of Computer Science and Engineering, Chalmers University of Technology, University of Gothenburg, Gothenburg, Sweden 2016, 75 pages.

Linewih, et al., "Failure Mechanism of E-FUSE for a Production Chip During the ESD Zapping Event," 2017 IEEE International Reliability Physics Symposium Proceedings, PM1.1-PM1.4. https://doi.org/10.1109/IRPS.2017.7936383, 4 pages.

* cited by examiner

SYSTEM-ON-A-CHIP TESTING FOR ENERGY HARVESTING DEVICES

BACKGROUND

Field

Subject matter disclosed herein may relate to wireless energy harvesting devices and may relate more particularly to system-on-a-chip testing for wireless energy harvesting devices.

Information

Evolution of the so-called Internet-of-Things (IoT) is expected to deploy a great many (e.g., millions, billions, etc.) of devices including wireless and/or battery-less devices such as, for example, computational radio frequency identification (C-RFID) tags, battery-less sensors and/or the like. In a particular implementations, processing circuits of such battery-less devices may be powered, at least in part, by intermittent radio frequency (RF) energy, intermittent light energy or intermittent acoustical energy, or a combination thereof, collected at the wireless and/or battery-less devices. Testing of such devices may pose significant challenges.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Figure 1:
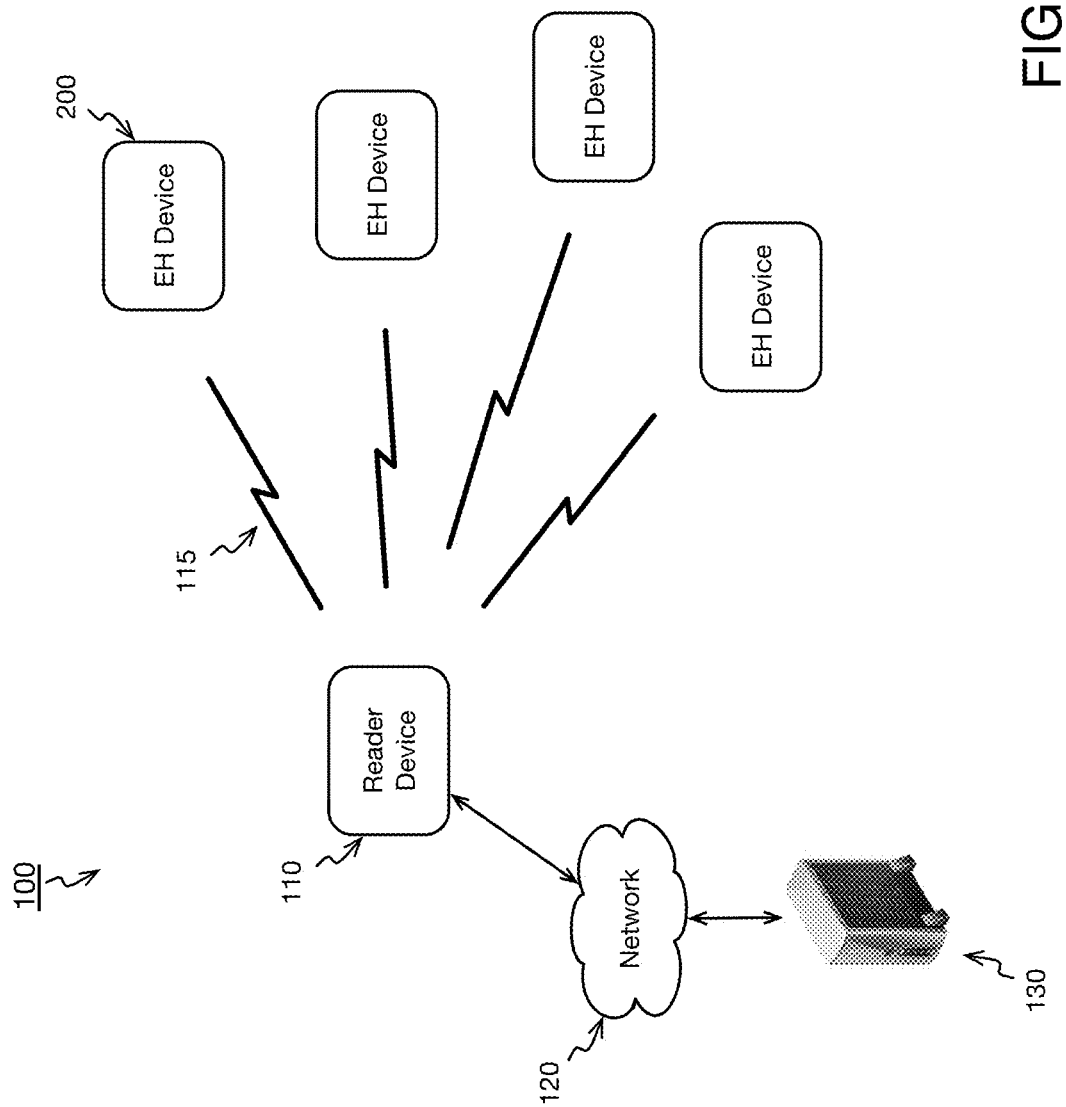
FIG. 1 is a system diagram illustrating certain features of a system containing one or more energy harvesting devices, according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As mentioned, evolution of the so-called Internet-of-Things (IoT) is expected to deploy a great many (e.g., millions, billions, etc.) of devices including wireless and/or battery-less devices such as, for example, computational radio frequency identification (C-RFID) tags, battery-less sensors and/or the like. In a particular implementations, processing circuits of such battery-less devices may be powered, at least in part, by intermittent radio frequency (RF) energy, intermittent light energy or intermittent acoustical energy, or a combination thereof, collected at the wireless and/or battery-less devices. Testing of such devices may pose significant challenges, as explained more fully below.

FIG. 1 is a schematic diagram illustrating certain features of a system 100 containing a number of compute-enabled, wireless energy harvesting devices 200, in accordance with an implementation. In the currently illustrated example implementation, a reader device 110 may transmit radio frequency (RF) signals 115 to one or more energy harvesting devices 200. In an implementation, the energy of RF signals 115 may be harvested, collected and/or stored, for example, at an energy harvesting device 200. In some implementations, energy harvesting device 200 may reflect and/or backscatter a portion of RF signals 115 back to reader device 110 and/or may modulate the reflected and/or backscattered portion of RF signals 115 to indicate particular detectable symbols and/or parameters (e.g., an identifier of an object associated with and/or co-located within an energy harvesting device 200).

Additionally, energy harvesting device 200 may harvest and/or collect energy received from RF signal 115 for use in powering one or more subsystems of energy harvesting device 200 (e.g., one or more processors, microprocessors, memory, sensors, transceiver devices, display devices, etc., not shown). For example, as explained more fully below, energy harvesting device 200 may include one or more antennae, resonating circuitry and/or structures, charge storage devices (e.g., capacitors) and/or the like to harvest and/or collect energy from a portion of RF signal 115 received at energy harvesting device 200. Operating without a battery power source, energy harvesting device 200 may from time-to-time harvest and/or collect energy of RF signal 115 to, for example, power embedded processing capabilities. In a particular implementation, reader device 110 may transmit RF signals 115 to multiple (e.g., up to 100 or more) energy harvesting devices 200 to, for example, provide power that is harvestable and/or collectable at energy harvesting devices 200. As discussed more fully below, in some implementations a relatively great number of energy harvesting devices 200 may be deployed.

In an embodiment, reader device 110 and an energy harvesting device 200 may communicate bidirectionally in that reader device 110 may transmit messages to energy harvesting devices 200 in a downlink signal (e.g., RF signal 115) and energy harvesting devices 200 may transmit messages to reader device 110 in an uplink signal. In one example, an uplink signal may comprise, for example, a signal indicating and/or expressing an identifier of a corresponding energy harvesting device 200 and/or object co-located with such a corresponding energy harvesting device 200. In an embodiment, an uplink signal may comprise a reflection of RF signal 115 that has been modulated with parameters and/or symbols to be detected and/or recovered at reader device 110. In particular implementations, reader device 110 and energy harvesting devices 200 may exchange messages via downlink and/or uplink signals according to one or more signal messaging formats set forth in one or more ISO/IEC 18000 conventions, for example, although subject matter is not limited in scope in this respect. In other examples in which an energy harvesting device 200 may comprise more advanced sensing and/or processing capabilities, uplink signals may comprise more robust messaging such as, for example, sensor measurements and/or values computed based, at least in part, on sensor measurements.

In an implementation, reader device 110 may transmit RF signals 115 at an RF signal power level of about one to two watts and/or may comprise a low voltage and/or battery operated device operating within a limited power budget such as, for example, ten watts, although subject matter is not limited in scope in these respects. In addition to a transceiver device (not shown) to transmit RF signal 115 and/or to process received signals transmitted from energy harvesting devices 200, reader device 110 may comprise a single board computer hosting a real-time operating system (e.g., Linux) to enable, for example, Internet access (e.g., via network 120 and/or server computing device 130) and/or to perform device management.

In some implementations, reader device 110 may be installed in a factory, warehouse or retail environment, for example, such that reader device 110 may remain powered continuously to service a relatively dense deployment of energy harvesting devices 200. Also, in some implementations, a great many energy harvesting devices 200 may be deployed. For example, in some implementations, thousands, millions, billions, etc., of energy harvesting devices 200 may be relatively extensively deployed over and/or within homes, hospitals, factories, farms, metropolitan areas, etc., to name but a few non-limiting examples. In some implementations, a locally deployed reader device 110 may service a relatively smaller local deployment of devices, while in other implementations a number of reader devices 110 may be employed to service a great many energy harvesting devices 200 and may not be continuously powered (e.g., periodically powered up and powered down) to conserve energy. Additionally, as discussed more fully below, a number of environmental and/or other factors may affect levels of RF power available for harvesting at energy harvesting devices 200.

For example, an intensity of collectable and/or harvestable power received energy harvesting device 200 from transmission of RF signal 115 may be determined based, at least in part, on a power level at which reader device 110 transmits RF signal 115 and/or other factors including, for example, a range and/or distance between reader device 110 and energy harvesting device 200, deviations from line-of-sight transmissions, presence of multi-path, presence of RF shadows from other energy harvesting devices 200, just to provide a few examples of such additional factors.

In the particular example depicted in FIG. 1, for simplicity of illustration system 100 includes multiple energy harvesting devices 200 to receive an RF signal 115 from a single reader device 110. It should be understood that in other implementations, an energy harvesting device 200 may communicate with and/or receive an RF signal from (e.g., to provide harvestable and/or collectable power) multiple different reader devices 110. Additionally, although not shown in system 100, energy harvesting device 200 may receive an RF signal from one or more power beacon devices that may be dedicated to providing harvestable and/or collectable power from an RF signal (e.g., without uplink and downlink messaging).

While particular example implementations discussed with reference to FIG. 1 are directed to use of RF signals to provide collectable and/or harvestable power and/or energy to energy harvesting devices, it should be understood that an RF signal is merely an example power signal and that implementations described herein may utilize different types of signals to deliver incident power. For example, in some implementations, collectable and/or harvestable power and/or energy may be delivered and/or derived from RF power signals, light power signal (e.g., IR) and/or acoustical power signal, just to provide a few examples.

Herein, "transponder," "transponder device," "tag," "tag device," "receiver," "receiver device," "sensor," "sensor device," "energy harvesting device" and/or the like refer to a device having capabilities to harvest RF energy and to receive wireless signal packets. In some implementations, such devices may have capabilities to acknowledge receipt of wireless signal packets. Herein, "transponder," "transponder device," "tag," "tag device," "receiver," "receiver device," "sensor," "sensor device," "energy harvesting device" and/or the like may be used interchangeably. In some implementations, a sensor device and/or energy harvesting device may comprise an IoT-type device, although subject matter is not limited in scope in this respect. Also, herein, "transmitter," "transmitter device," "reader," "reader device" and/or the like refer to devices having a capability to transmit wireless signal packets and/or to obtain acknowledgment of receipt of wireless signal packets from receiver devices. "Transmitter," "transmitter device," "reader," "reader device" and/or the like may be utilized interchangeably herein.

Figure 2:
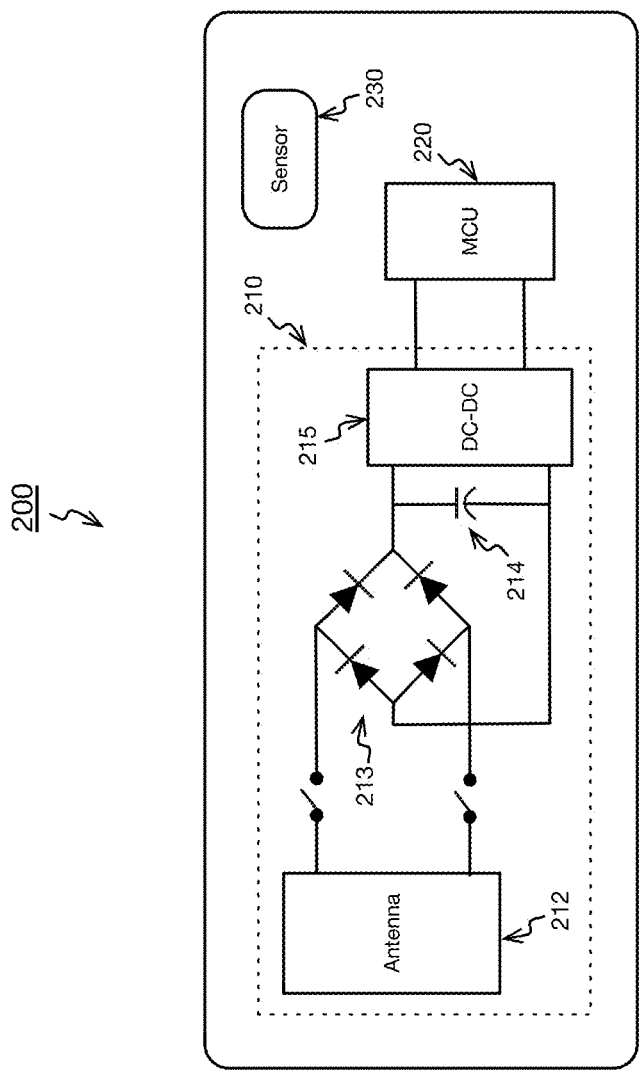
FIG. 2 is a schematic block diagram illustrating an example energy harvesting device, according to an embodiment.

FIG. 2 is a schematic block diagram illustrating an example embodiment of energy harvesting device 200. In an implementation, energy harvesting device 200 may include energy-harvesting circuitry 210 that may include, for example, one or more antennae 212, a rectifier circuit 213, a capacitor 214 and/or a dc-dc converter/voltage regulator 215. However, it should be noted that particular configuration of energy-harvesting circuitry 210 depicted in FIG. 2 and/or described is merely an example and subject matter is not limited in scope in these respects.

As mentioned, an incident power signal may enable an energy harvesting device, such as energy harvesting device 200, to power one or more subsystems from signal energy collected and/or harvested from an incident power signal. Such subsystems may include, for example, sensors, circuitry for conditioning sensor signals, analog-to-digital circuitry for sampling conditioned sensor signals, processors and non-volatile memory for processing sensor signals and for performing related computations, RF circuitry for transmitting and/or receiving messages, etc., just to provide a few non-limiting examples of subsystems of an energy harvesting device that may be powered from power and/or energy collected and/or harvested from a received incident power signal.

In an implementation, energy harvesting device 200 may include computational circuitry, such as one or more processors. For example, energy harvesting device 200 may include a microcontroller (MCU) 220. Further, in some implementations, energy harvesting device 200 may include one or more sensors 230. As utilized herein, "sensor" and/or the like refers to an electronic circuit, component and/or device that generates one or more signals and/or signal packets in response to one or more stimuli (e.g., one or more physical phenomena). In an embodiment, sensors may include, to name a few non-limiting examples, one or more radio frequency sensors/transceivers, cameras, microphones, accelerometers, altimeters, gyroscopes, compasses, thermometers, magnetometers, barometers, light sensors, biometric sensors or proximity sensors, or any combination thereof. Further, "sensor," "sensor device" and/or the like refers to an electronic and/or computing device that includes one or more sensors and/or that processes signals and/or signal packets obtained from one or more sensors. Thus, in some implementations, energy harvesting device 200 may comprise a sensor device. As mentioned, herein, "sensor device" and "energy harvesting device" and/or the like may be used interchangeably. In an implementation, MCU 220 and/or sensors 230 may be powered from energy harvested and/or collected from a received incident power signal, for example.

Figure 3:
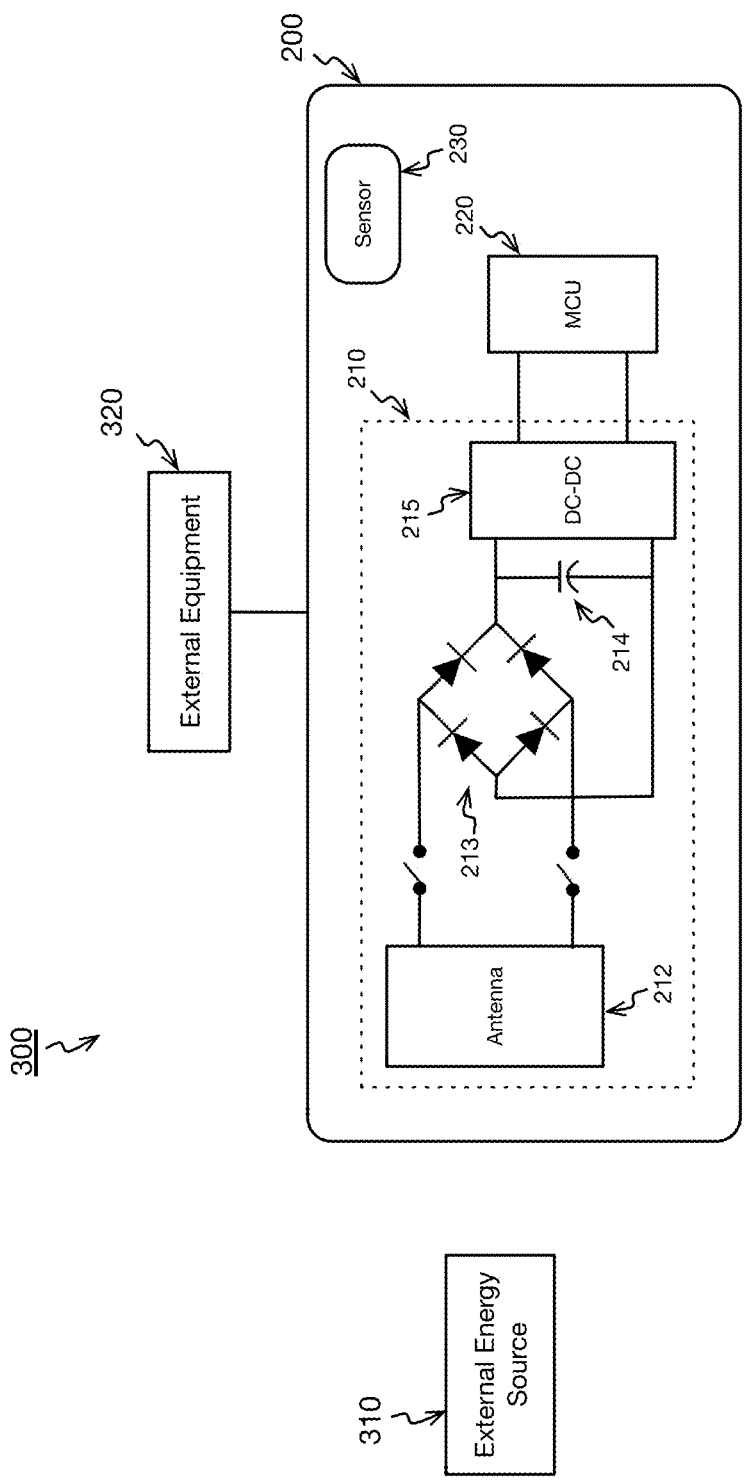
FIG. 3 is a schematic block diagram illustrating an example energy harvesting device undergoing testing.

FIG. 3 is a schematic block diagram illustrating example energy harvesting device 200 undergoing testing in accordance with an implementation. As mentioned, in some implementations, a relatively great number of energy harvesting devices, such as energy harvesting devices 200 and/or the like, may be deployed. Deployment of such vast numbers of devices may pose a number of challenges such as, for example, testing of devices to ensure proper operation and/or to verify viability of particular workloads (e.g., particular operations stored in firmware to be executed by computational circuitry, such as a processor) given particular energy scenarios. In some circumstances, to test a device, such as energy harvesting device 200 or the like, an external energy source, such as external energy source 310, may provide energy to be harvested by the device under test. Further, in some circumstances, external equipment, such as external equipment 320, may measure energy harvested and/or consumed by the device under test while running a particular workload. Also, in some circumstances, an external energy source may provide energy to dc-dc converter 215, for example, to simulate harvesting of energy. A number of different workloads may be tested to determine particular firmware, for example, that may be advantageously employed for particular energy, power and/or performance conditions.

However, it may be difficult to simulate real-world conditions in a laboratory setting. Also, testing of energy harvesting devices after being deployed during real-world conditions poses significant challenges. For example, the testing procedures mentioned above may rely on external power sources (e.g., external energy source 310) and/or other external equipment (e.g., external equipment 320) such as multimeters and/or other measurement devices. External energy sources and/or external equipment for testing purposes may be relatively costly and/or may also limit automation of tests that might be run on various particular workloads across a variety of distinct energy scenarios that might be experienced by energy harvesting devices once deployed. More particularly, the testing approaches mentioned above (e.g., utilizing external equipment in a laboratory setting) may not enable testing of particular software/firmware workloads on particular energy harvesting devices under real-world conditions.

For example, a number of energy harvesting devices, such as IoT-type devices, for example, may be deployed in non-accessible and/or difficult-to-access locations such as, for example, in pipes, underwater, underground, at elevation, within building structures (e.g., buried in concrete), etc. In many circumstances, it may be unfeasible, costly, inefficient and/or impossible to place external test equipment near enough to deployed energy harvesting devices to be able to test different workloads under real-world conditions and/or under different energy scenarios. Additionally, moving relatively bulky and/or heavy test equipment from deployed device to deployed device to test different workloads under various real-world conditions and/or various energy scenarios may be impractical. In short, once energy harvesting devices, such as energy harvesting device 200, are deployed it may be difficult to test different software and/or firmware workloads under different real-world conditions to allow for selection and/or design of appropriate software and/or firmware for the given real-world conditions. Further, testing prior to deployment may not adequately simulate and/or anticipate real-world conditions to enable selection and/or design of appropriate software and/or firmware for the given real-world conditions.

Figure 4:
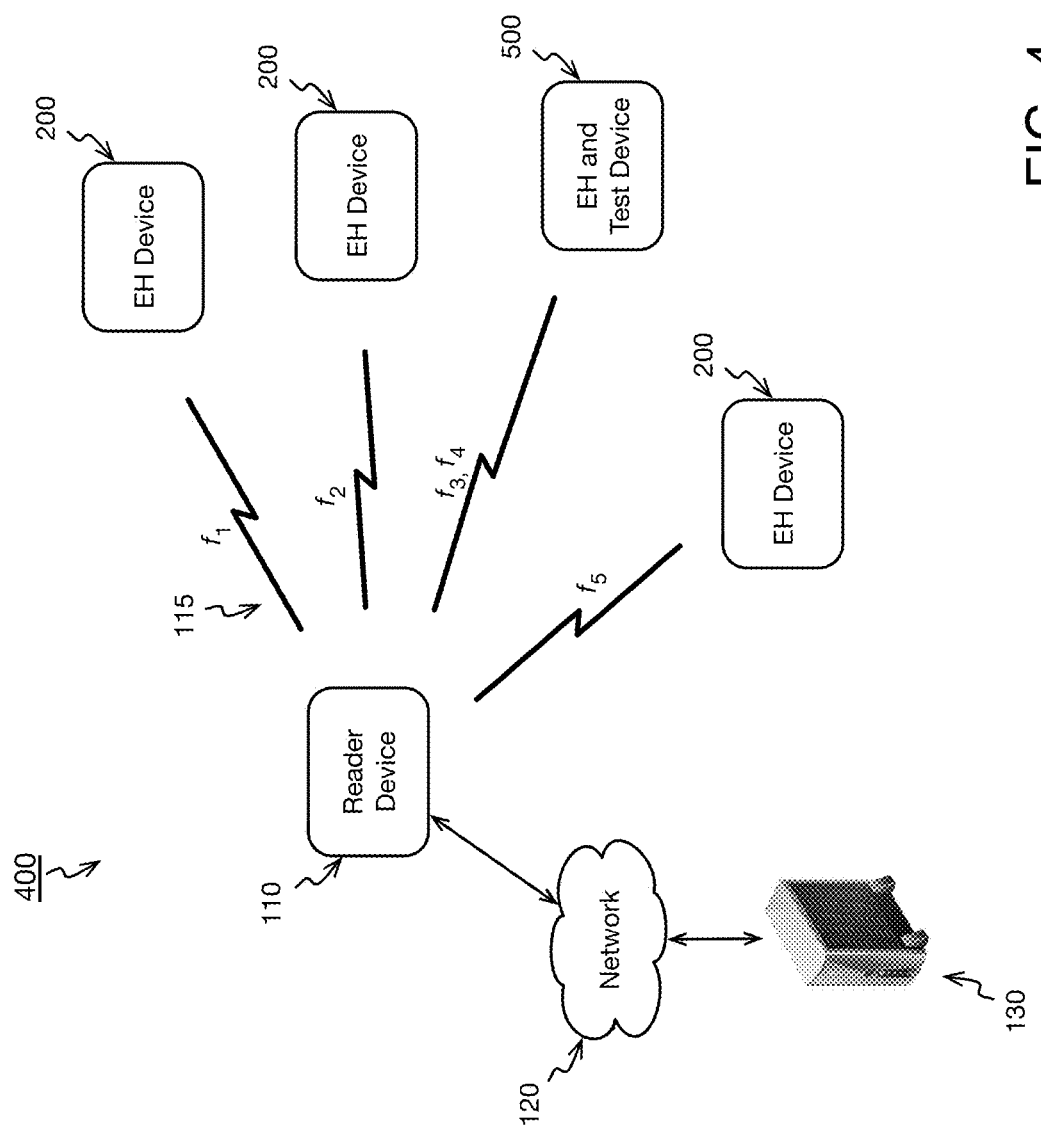
FIG. 4 is a system diagram illustrating certain features of a system containing one or more energy harvesting devices and one or more energy harvesting and testing devices, according to an embodiment.

To address the challenges mentioned above, embodiments described herein may include deployment of a number of test-enabled energy harvesting devices along with a number of non-test-enabled energy harvesting devices. For example, FIG. 4 depicts an example system 400 including a number of energy harvesting devices 200 and one or more energy harvesting and testing devices 500, according to an embodiment. Further, as discussed more fully below, energy harvesting and testing device 500 may comprise a system-on-a-chip (SOC)-type device wherein energy harvesting circuitry and test circuitry are implemented on a particular integrated circuit die and/or within a particular semiconductor device package.

In some implementations, a number of energy harvesting devices, such as energy harvesting device 200, may be deployed (e.g., within a particular building, structure, geographical region, etc.) along with a relatively smaller number of energy harvesting and testing devices 500. For example, in a particular implementation, one to ten percent of a total number of deployed IoT-type devices may comprise test-enabled energy harvesting devices, such as energy harvesting and testing devices 500, although subject matter is not limited in scope in this respect. By implementing test circuitry on the same integrated circuit die and/or within the same semiconductor package as energy harvesting circuitry for some deployed devices, different software and/or firmware workloads may be tested on deployed devices under real-world conditions. Also, by deploying relatively fewer test-enabled energy harvesting devices (e.g., energy harvesting and testing device 500) along with a relatively greater number of non-test-enabled energy harvesting devices (e.g., energy harvesting device 200), the benefits and/or advantages of in situ, real-world testing may be obtained without adding cost to the vast majority of energy harvesting devices (e.g., IoT-type devices) to be deployed.

In an implementation, RF signals 115 may be transmitted and/or received between reader device 100 and the various energy harvesting devices 200 and/or energy harvesting and testing devices 500 at different frequencies (e.g., $f_1$, $f_2$, $f_3$, etc.). Also, as discussed below, energy harvesting and testing device 500 may receive and/or transmit RF signals at more than one frequency (e.g., $f_4$, $f_5$).

Figure 5:
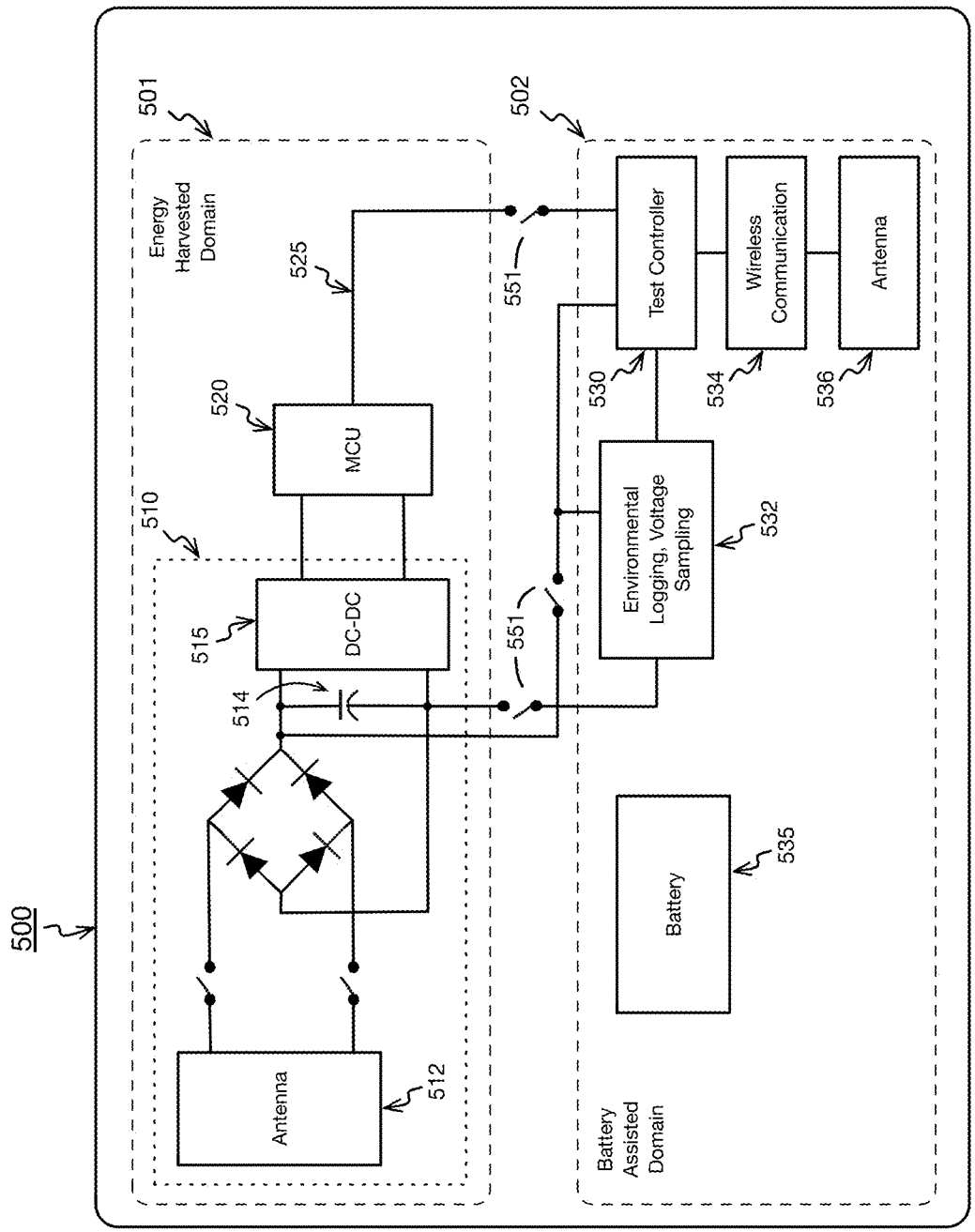
FIG. 5 is a schematic block diagram illustrating an example energy harvesting device and testing circuitry implemented on a particular integrated circuit die, according to an embodiment.

FIG. 5 is a schematic block diagram illustrating example energy harvesting and testing device 500, according to an embodiment. In an implementation, energy harvesting and testing device 500 may include circuitry implemented within an energy-harvested domain 501 and may also include circuitry implemented within a battery-assisted domain 502.

In an implementation, energy-harvested domain 501 may comprise a number of characteristics similar to those discussed above in connection with energy harvesting device 200. For example, energy-harvested domain 501 may include energy harvesting circuitry 510 and an MCU 520. In an implementation, energy harvesting circuitry 510 may include one or more antennae 512, rectification circuitry, a capacitor and/or a dc-dc converter/voltage regulator 515, although subject matter is not limited in scope in these respects.

Also, in an implementation, battery-assisted domain 502 may include various test circuitry that may be utilized to initiate and/or perform various testing operations, routines and/or procedures in conjunction with energy harvesting circuitry 510 and/or MCU 520, for example. In an implementation, testing circuitry may include a test controller 530 and may also include a battery 535. In other implementations, testing circuitry may further include environmental logging and/or voltage sampling circuitry 532. A wireless communication interface 534 may also be included, for example. In an implementation, battery-assisted domain 502 may also include one or more antennae 536 that may operate at one or more different frequencies than antenna 512. For example, wireless signals and/or signal packets may be transmitted and/or received via wireless communication interface 534 and/or antenna 536.

In an implementation, MCU 520 may be powered by energy harvesting circuitry 510. For example, RF signal power received at antenna 512 may be rectified and/or otherwise conditioned and may further be regulated by dc-dc converter 515 and provided to MCU 520. During test mode, MCU 520 may alternatively be powered via power supplied by battery 535, for example. In an implementation, test controller 530 may be power via battery 535.

As indicated in FIG. 5, MCU 520 may communicate with test controller 530 by way of debug interface 525. In an implementation, debug interface 525 may comprises one or more signal lines implemented in substantial compliance with, for example, a serial peripheral interface (SPI) protocol, a universal asynchronous receiver-transmitter (UART) protocol, a general purpose input/output (GPIO) protocol, etc., although subject matter is not limited in scope in this respect. During testing and/or debugging operations test controller 530 may also communicate real-time clock (RTC, not shown) signals and/or parameters to MCU 520.

Further, during testing and/or debug operations, test controller 530 may communicate system interrupts to MCU 520 via debug interface 525. In an implementation, interrupts may signal any of a variety of events and/or conditions to a processor, such as MCU 520. For example, test controller 530 may signal power on and/or power off conditions via one or more interrupt signals and/or signal packets. One or more sleep and/or shutdown modes of operation may be indicated to MCU 520 by test controller 530 via one or more interrupt signals and/or signal packets, for example. Other example interrupt signals and/or signal packets that may be indicated by test controller 530 to MCU 520 via debug interface 525 may include, but are not limited to, low voltage detected and/or voltage increase detected.

In an implementation, test controller 530 may be programmed with any of a number of routines (R) that may emulate any of a wide range of energy scenarios (E). Execution of routines R via test controller 530 may initiate communication of appropriate signals and/or signal packets to MCU 520, for example, to simulate the behavior of a device under different voltage conditions (e.g., no voltage, different voltage ranges, etc.).

In an implementation, particular interrupt messages may trigger execution of particular interrupt handler operations in MCU 520. For example, for an emulation of a condition wherein a voltage available to MCU 520 is increasing rapidly, an interrupt may be signaled to indicate to MCU 520 to increase its clock speed to enable completion of current computations sooner. For another example, for an emulation of a condition wherein a voltage available to MCU is decreasing, an interrupt may be signaled to MCU 520 to initiate backup (e.g., storage in non-volatile memory) of particular variables and/or parameters for a current computation and/or to initiate a sleep and/or shutdown mode. Further, an emulation of a power-on and/or wake event may be initiated via an appropriate interrupt signal and/or signal packet communicated to MCU 520, wherein MCU 520 may resume a previous computation including restoring previously backed-up variables and/or parameters.

As discussed above, implementations may include systems, devices and/or processes that may enable testing and/or characterization of energy harvested devices, such as energy harvested device 200, with no external equipment. By implemented test circuitry, including, for example, battery-assisted circuitry, in a relatively small subset of deployed energy harvested devices, automated testing of different software and/or firmware workloads under different energy scenarios may be enabled without the challenges faced in trying to interface external energy sources and/or external testing equipment with difficult and/or impossible-to-access deployed devices.

In an implementation, one or more switches 551 may be provided between battery-assisted domain circuitry 502 and energy harvested domain circuitry 501. During normal and/or testing modes of operation, switches 551 may be closed (e.g., current is allowed to flow), thereby enabling conduction of current between energy harvested domain circuitry 501 and battery assisted domain circuitry 502. In an implementation, a voltage level for battery 535 may be periodically sampled and/or otherwise monitored. In response to battery 535 falling below a specified (e.g., preconfigured and/or programmed) threshold voltage level, a remaining amount of energy stored at battery 535 may be utilized to open switches 551, thereby disconnecting energy harvested domain circuitry 501 from battery assisted domain circuitry 502, for example. In this manner, battery assisted domain circuitry 502 may be prevented from drawing power from energy harvesting circuitry 510 once battery 535 has run out of power, for example. In an implementation, switches 551 may comprise fuses that may be manufactured in the "closed" position (e.g., current is allowed to flow through the fuse) and/or that may be permanently opened or "blown" via application of sufficient current and/or voltage.

Additionally, in an implementation, battery 535 may be recharged. For example, an RF signal may be received at an antenna, such as antenna 512 and/or antenna 536 implemented as part of battery assisted domain circuitry 502. In an implementation, energy derived from RF signals received at antenna 512 and/or antenna 536 may be utilized to charge battery 535. In an implementation, antenna 536 may receive RF signals transmitted at a different frequency than that of signals received at antenna 512. Further, for example, RF signals received at antenna 536 utilized to recharge batter 535 may comprise relatively higher-powered RF signals. In an implementation, an RF signal may be authenticated via authenticating a key value communicated via the RF signal and/or by allowing RF signals of only one or more particular frequencies to be utilized to charge battery 535. In providing means for recharging battery 535, testing system durability and/or longevity may be enhanced.

In a further implementation, battery assisted domain circuitry 502, such as environmental logging and/or voltage sampling circuitry 532, may monitor RF signals and/or other conditions to detect attacks directed at energy harvest devices, such as energy harvested devices 200 and/or 500. For example, frequency sweeps may be detected. In an implementation, particular commands received via RF signals may be detected. For example, specified (e.g., custom), non-implemented and/or KILL commands (e.g., from GEN2 protocol) that may not be supported by particular IoT-type devices, such as energy harvested devices 200, may be detected. Also, for example, particular commands repeated over different frequencies may be detected. Additionally, in an implementation, particular queries received via RF signals may be detected. Also, the presence of command at unexpected frequencies may be detected. Of course, these are merely examples of the types of attacks that may be detected, and subject matter is not limited in scope in these respects. In an implementation, detected attacks may be logged (e.g., stored in non-volatile memory) for reading at a later point in time.

Additionally, battery assisted domain circuitry 502 may also include an analog-to-digital converter (ADC, not shown) that may be utilized, at least in part, to monitor and/or periodically sample voltage across capacitor 514, for example. In other implementations, the ADC may be eliminated to reduce costs.

In some implementations, it may be advantageous to delay enablement of testing circuitry, such as battery assisted domain circuitry 502, for a period of time following deployment. For example, consider an application wherein a number of energy harvested devices 200 and energy harvested and testing devices 500 are to be deployed throughout a building under construction. Due to the noise, vibrations, etc. that may occur during construction of the building, for example, battery power for energy harvested and testing devices 500 may drain rapidly if enabled during construction of the building. It may make more sense to delay enablement of testing circuitry until some period of time after deployment. For example, energy harvested and testing devices 500 may begin testing operations at some point in time after construction of the building has completed.

To accomplish delayed enablement of testing circuitry, a real-time clock (RTC, not shown) located within battery assisted domain circuitry 502 may be utilized to track time, in an implementation. The RTC may be powered by battery 535, for example. In an implementation, prior to and/or concurrent with deployment, test controller 530 and/or other testing circuitry of battery-assisted domain circuitry 502 may be placed in a sleep mode of operation. In an implementation, after a specified period of time as measured at least in part via the RTC, test controller 530 and/or other testing circuitry may become enabled. In some implementations, battery-assisted circuits may be turned on and off in accordance with particular specifications.

Figure 6:
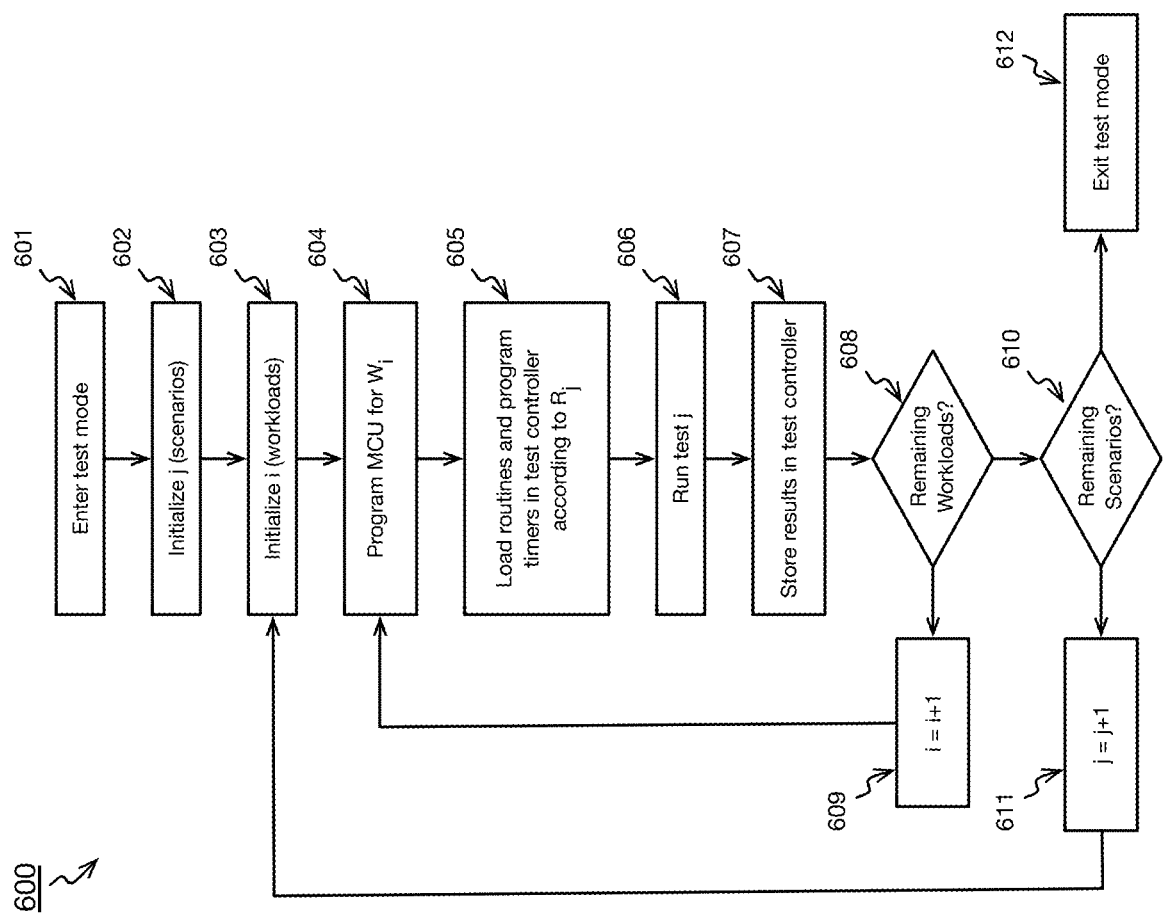
FIG. 6 is a diagram illustrating an example process for testing an energy harvesting device, in accordance with an embodiment.

FIG. 6 is a diagram illustrating an embodiment 600 of an example process for testing an energy harvesting device. As mentioned, battery assisted testing circuitry, such as battery assisted domain circuitry 502, may be utilized to automatically test operation of energy harvested devices (e.g., energy harvested domain circuitry 501) running different software and/or firmware workloads W under different energy scenarios E. Energy scenarios E may emulate, at least in part, real-world environments (e.g., factory having IoT devices located in different positions, etc.). Example process 600 depicts an example technique for automating the testing of an energy harvested device running different software and/or firmware workloads W under different energy scenarios E.

As depicted at blocks 601, 602 and 603, upon entering a test mode, variables i and j may be initialized to a particular value (e.g., "0"), for example. In an implementation, MCU 520 may be programmed in accordance with a particular software and/or firmware workload $W_i$ of W, as indicated at block 604. Further, as indicated at block 605, routines may be loaded and/or timers may be programmed, for example, in test controller 530 in accordance with a particular routine $R_j$ (e.g., associated with a particular energy scenario $E_j$ of E), for example.

Further, as indicated at block 606, MCU 520 may execute the programmed software and/or firmware workload $W_i$ under the control of test controller 530 implementing routine $R_j$, for example. In an implementation, test results may be stored in test controller 530, for example, and/or stored in a non-volatile memory as indicated at block 607. In an implementation, test results may be accessed via wireless communication interface 534 and/or antenna 536, for example.

In an implementation, following a particular test run, a determination may be made as to whether additional workloads in W remain to be tested under the current energy scenario as indicated at block 608. At least in part in response to additional workloads remaining, the variable "i" may be incremented and a next workload $W_i$ may be programmed into MCU 520, as indicated at blocks 609 and 604. Further, as indicated at block 610, at least in part in response to all of the specified workloads W having been tested under current energy scenario $E_j$, a determination may made as to whether additional energy scenarios in E remain to be tested. Responsive at least in part to all workloads W having been tested under all specified energy scenarios E, test mode may be exited as indicated at block 612. However, for a determination that additional energy scenarios in E remain, variable j may be incremented, as indicated at block 611, and processing may return to block 603 where the variable i may again initialized so that the range of specified workloads W may be tested under the new energy scenario in an implementation.

Embodiments in accordance with claimed subject matter may include all of blocks 601-612, fewer than blocks 601-612, or greater than blocks 601-612. Also, the order of blocks 601-612 is merely an example, and claimed subject matter is not limited in scope in these respects. It should be noted that content acquired or produced, such as, for example, input signals, output signals, operations, results, etc. associated with example process 600 may be represented via one or more digital signals. It should also be appreciated that even though one or more operations are illustrated or described concurrently or with respect to a certain sequence, other sequences or concurrent operations may be employed. In addition, although the description herein references particular aspects and/or features illustrated in certain other figures, one or more operations may be performed with other aspects and/or features.

Figure 7:
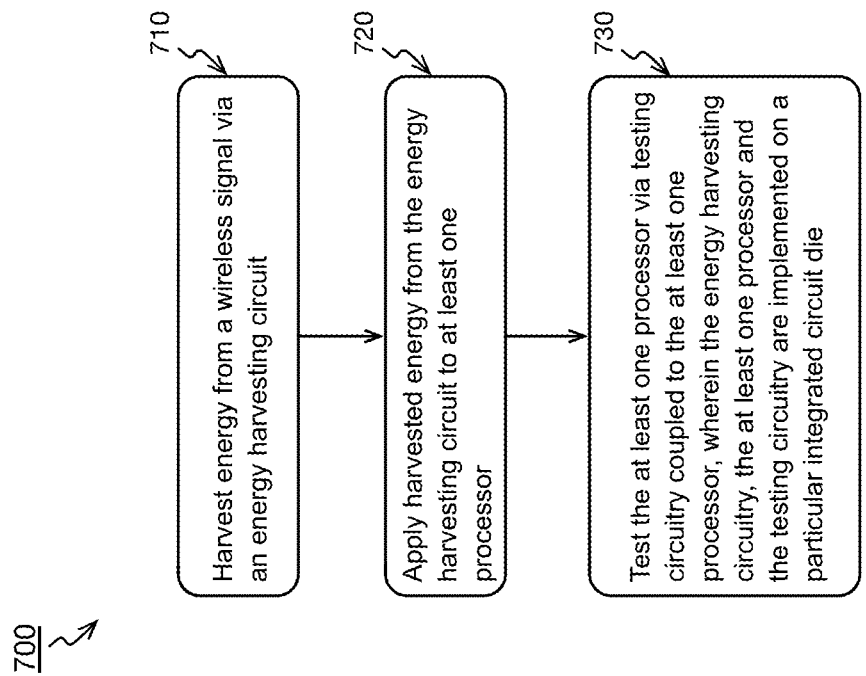
FIG. 7 is a diagram illustrating an example process for testing an energy harvesting device, in accordance with an embodiment.

FIG. 7 is a diagram illustrating an embodiment 700 of an example process for testing an energy harvesting device. Example process 700 describes in a general way some of the main characteristics of various example implementations described above. Embodiments in accordance with claimed subject matter may include all of blocks 710-730, fewer than blocks 710-730, or greater than blocks 710-730. Also, the order of blocks 710-730 is merely an example, and claimed subject matter is not limited in scope in these respects. It should be noted that content acquired or produced, such as, for example, input signals, output signals, operations, results, etc. associated with example process 700 may be represented via one or more digital signals. It should also be appreciated that even though one or more operations are illustrated or described concurrently or with respect to a certain sequence, other sequences or concurrent operations may be employed. In addition, although the description herein references particular aspects and/or features illustrated in certain other figures, one or more operations may be performed with other aspects and/or features.

In an implementation, energy may be harvested at an energy harvested device, such as energy harvested and testing device 500, from a wireless signal (e.g., RF signal 115) via an energy harvesting circuit, such as energy harvesting circuit 510, as indicated at block 710. As further indicated at block 720, harvested energy may be applied to at least one processor, such as MCU 520, for example. As additionally indicated at block 730, the processor, such as MCU 520, may be tested utilizing testing circuitry, such as test controller 530 and/or other circuitry of battery assisted domain circuitry 502, for example. In an implementation, the processor and testing circuitry are implemented on a particular integrated circuit die. In another implementation, the processor and testing circuitry may be implemented within a particular semiconductor package, for example.

It should be noted that the various circuits disclosed herein may be described using computer aided design tools and expressed (or represented), as data and/or instructions embodied in various machine-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Storage media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

If received within a computer system via one or more machine-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, particularly a wireless network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, "coupled" is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, that the particular situation be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall within the abstract idea judicial exception to statutory subject matter. Rather, it is asserted, that physical measurements are not mental steps and, likewise, are not abstract ideas.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

For example, a relatively large number of measurements may be collected to better estimate a deterministic component. Likewise, if measurements vary, which may typically occur, it may be that some portion of a variance may be explained as a deterministic component, while some portion of a variance may be explained as a random component. Typically, it is desirable to have stochastic variance associated with measurements be relatively small, if feasible. That is, typically, it may be preferable to be able to account for a reasonable portion of measurement variation in a deterministic manner, rather than a stochastic matter as an aid to identification and/or predictability.

Along these lines, a variety of techniques have come into use so that one or more measurements may be processed to better estimate an underlying deterministic component, as well as to estimate potentially random components. These techniques, of course, may vary with details surrounding a given situation. Typically, however, more complex problems may involve use of more complex techniques. In this regard, as alluded to above, one or more measurements of physical manifestations may be modelled deterministically and/or stochastically. Employing a model permits collected measurements to potentially be identified and/or processed, and/or potentially permits estimation and/or prediction of an underlying deterministic component, for example, with respect to later measurements to be taken. A given estimate may not be a perfect estimate; however, in general, it is expected that on average one or more estimates may better reflect an underlying deterministic component, for example, if random components that may be included in one or more obtained measurements, are considered. Practically speaking, of course, it is desirable to be able to generate, such as through estimation approaches, a physically meaningful model of processes affecting measurements to be taken.

In some situations, however, as indicated, potential influences may be complex. Therefore, seeking to understand appropriate factors to consider may be particularly challenging. In such situations, it is, therefore, not unusual to employ heuristics with respect to generating one or more estimates. Heuristics refers to use of experience related approaches that may reflect realized processes and/or realized results, such as with respect to use of historical measurements, for example. Heuristics, for example, may be employed in situations where more analytical approaches may be overly complex and/or nearly intractable. Thus, regarding claimed subject matter, an innovative feature may include, in an example embodiment, heuristics that may be employed, for example, to estimate and/or predict one or more measurements.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be substantially present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices and/or one or more server devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device and/or a client device, as well as other types of devices, including between wired and/or wireless devices coupled via a wired and/or wireless network, for example.

In the context of the present patent application, the term network device refers to any device capable of communicating via and/or as part of a network and may comprise a computing device. While network devices may be capable of communicating signals (e.g., signal packets and/or frames), such as via a wired and/or wireless network, they may also be capable of performing operations associated with a computing device, such as arithmetic and/or logic operations, processing and/or storing operations (e.g., storing signal samples), such as in memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, sensor devices, energy harvested devices, IoT-type devices, netbooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate. Along similar lines, references to a "database" are understood to mean, one or more databases and/or portions thereof, as appropriate.

The term electronic file and/or the term electronic document are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

In the context of the present patent application, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present patent application, a component is physical, but is not necessarily tangible. As an example, components with reference to an electronic document and/or electronic file, in one or more embodiments, may comprise text, for example, in the form of physical signals and/or physical states (e.g., capable of being physically displayed). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed). In an embodiment, digital content may comprise, for example, text, images, audio, video, and/or other types of electronic documents and/or electronic files, including portions thereof, for example.

Also, in the context of the present patent application, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this patent application, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present patent application, to have particular implications with respect to the one or more signals being communicated, such as, for example, whether the signals are being communicated "to" a particular device, whether the signals are being communicated "from" a particular device, and/or regarding which end of a communication path may be initiating communication, such as, for example, in a "push type" of signal transfer or in a "pull type" of signal transfer. In the context of the present patent application, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular patent application, a network protocol, such as for communicating between devices of a network, may be characterized, at least in part, substantially in accordance with a layered description, such as the so-called Open Systems Interconnection (OSI) seven layer type of approach and/or description. A network computing and/or communications protocol (also referred to as a network protocol) refers to a set of signaling conventions, such as for communication transmissions, for example, as may take place between and/or among devices in a network. In the context of the present patent application, the term "between" and/or similar terms are understood to include "among" if appropriate for the particular usage and vice-versa. Likewise, in the context of the present patent application, the terms "compatible with," "comply with" and/or similar terms are understood to respectively include substantial compatibility and/or substantial compliance.

A network and/or sub-network, in an embodiment, may communicate via signal packets and/or signal frames, such as via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, 4G, or 5G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), 802.11b/g/n, and/or the like. A wireless network may include virtually any type of now known and/or to be developed wireless communication mechanism and/or wireless communications protocol by which signals may be communicated between devices, between networks, within a network, and/or the like, including the foregoing, of course.

Figure 8:
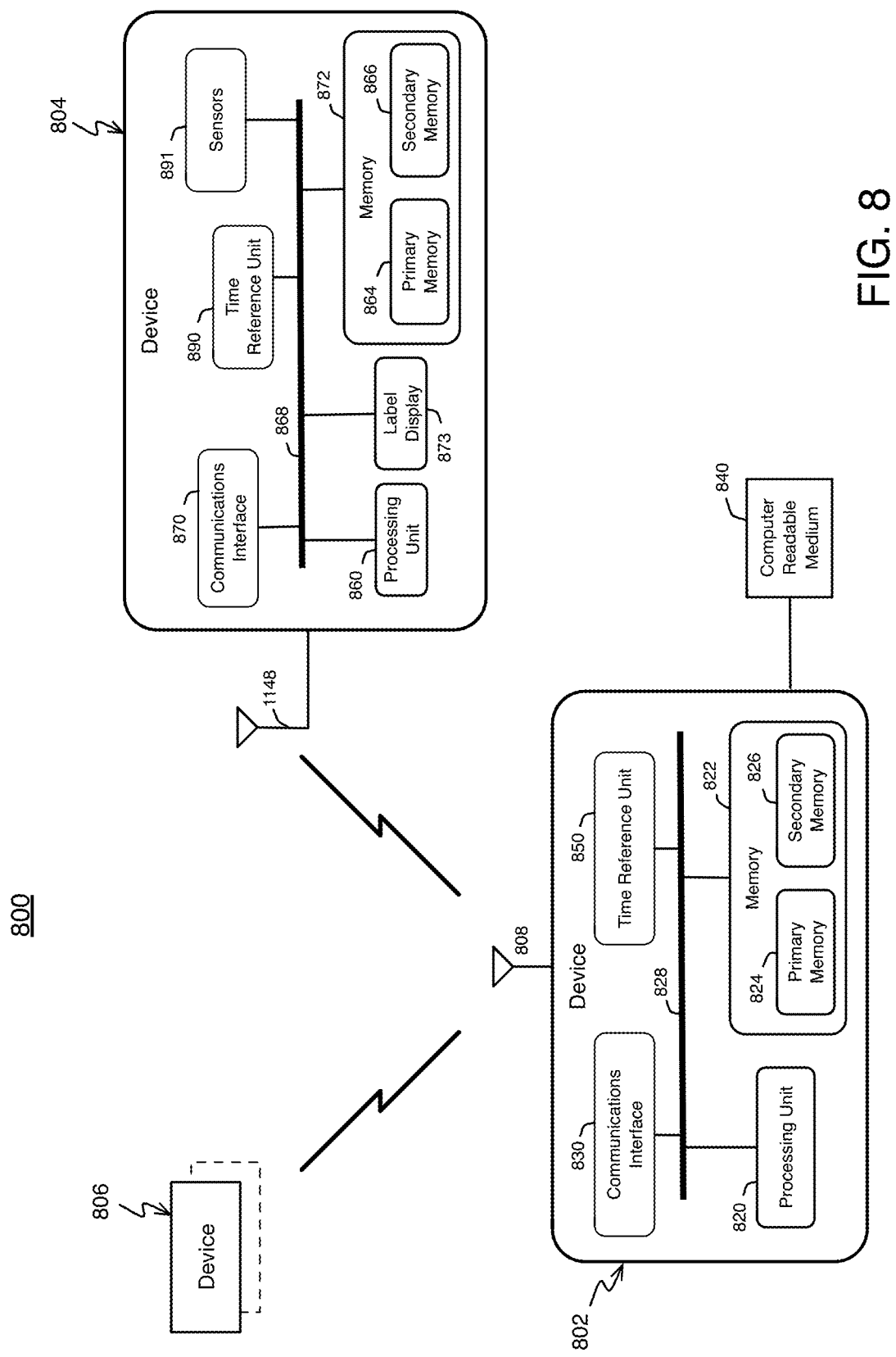
FIG. 8 is a schematic block diagram of an example computing system in accordance with an implementation.

In example embodiments, as shown in FIG. 8, a system embodiment may comprise a local network (e.g., device 802 and medium 840) and/or another type of network, such as a computing and/or communications network. For purposes of illustration, therefore, FIG. 8 shows an embodiment 800 of a system that may be employed to implement either type or both types of networks. A network may comprise one or more network connections, links, processes, services, applications, and/or resources to facilitate and/or support communications, such as an exchange of communication signals, for example, between a computing device, such as device 802, and another computing device, such as 804, which may, for example, comprise one or more client computing devices and/or one or more server computing device.

Example devices in FIG. 8 may comprise features, for example, of a computing devices to implement a reader device (e.g., reader device 102, FIG. 1A) and/or a transponder device (e.g., transponder device 104, FIG. 1A), in an embodiment. It is further noted that the term computing device, in general, whether employed as a client and/or as a server, or otherwise, refers at least to a processor and a memory connected by a communication bus. A "processor" or "processing unit," for example, is understood to connote a specific structure such as a central processing unit (CPU) of a computing device which may include a control unit and an execution unit. In an aspect, a processor may comprise a device that interprets and executes instructions to process input signals to provide output signals. As such, in the context of the present patent application at least, computing device and/or processor are understood to refer to sufficient structure within the meaning of 35 USC § 112 (f) so that it is specifically intended that 35 USC § 112 (f) not be implicated by use of the term "computing device," "processor" and/or similar terms; however, if it is determined, for some reason not immediately apparent, that the foregoing understanding cannot stand and that 35 USC § 112 (f), therefore, necessarily is implicated by the use of the term "computing device," "processor" and/or similar terms, then, it is intended, pursuant to that statutory section, that corresponding structure, material and/or acts for performing one or more functions be understood and be interpreted to be described at least in FIGS. 1-7, and in the text associated with the foregoing FIGS. 1-7 of the present patent application.

FIG. 8 is a schematic diagram illustrating an example system 800 that may include one or more devices configurable to implement techniques or processes described above, for example, in connection with FIGS. 1-7. System 800 may include, for example, a first device 802, a second device 804, and a third device 806, which may be operatively coupled together through a wireless communications techniques described above.

First device 802, second device 804 and third device 806, as shown in FIG. 8, may be representative of any device, appliance or machine that may be configurable to exchange signals and/or messages over a wireless communications network. By way of example but not limitation, any of first device 802, second device 804, or third device 806 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or data storage service provider/system, a network service provider/system, an Internet or intranet service provider/system, a portal or search engine service provider/system, a wireless communication service provider/system; or any combination thereof. Any of the first, second, and third devices 802, 804, and 806, respectively, may comprise one or more of a reader device or a transponder device in accordance with the examples described herein.

Similarly, a wireless communications network, as shown in FIG. 8, may be representative of one or more communication links, processes, or resources configurable to support the exchange of signals and/or messages between at least two of first device 802, second device 804, and third device 806. By way of example but not limitation, a wireless communications network may include wireless or wired communication links, telephone or telecommunications systems, data buses or channels, optical fibers, terrestrial or space vehicle resources, local area networks, wide area networks, intranets, the Internet, routers or switches, and the like, or any combination thereof. In an embodiment, wireless communication links in a wireless communication link may enable one or more signal messaging formats set forth in one or more ISO/IEC 18000 conventions.

It is recognized that all or part of the various devices and networks shown in FIG. 8, and the processes and methods as further described herein, may be implemented using or otherwise including hardware, firmware, software, or any combination thereof.

Thus, by way of example but not limitation, first device 802 may include at least one processing unit 820 that is operatively coupled to a memory 822 through a bus 828. Likewise, second device 804 may include at least one processing unit 860 that is operatively coupled to a memory 872 through a bus 868.

Processing unit 820 and/or processing unit 860 may be representative of one or more circuits configurable to perform at least a portion of a computing procedure or process. By way of example but not limitation, processing unit 820 and/or processing unit 860 may include one or more processors, controllers, microprocessors, microcontrollers, application specific integrated circuits, digital signal processors, programmable logic devices, field programmable gate arrays, and the like, or any combination thereof.

Memory 822 and/or memory 872 may be representative of any mechanism for use in storing executable instructions, input/output values, parameters, measurements and/or symbols, etc. Memory 822 may include, for example, a primary memory 824 or a secondary memory 826. Likewise, memory 872 may include, for example, a primary memory 864 or a secondary memory 866. Primary memory 824 and/or 864 may include, for example, a random access memory, read only memory, non-volatile memory, etc. While illustrated in this example as being separate from processing unit 820, it should be understood that all or part of primary memory 824 may be provided within or otherwise co-located/coupled with processing unit 820. Likewise, it should be understood that all or part of primary memory 864 may be provided within or otherwise co-located/coupled with processing unit 860. In a particular implementation, memory 822 and processing unit 820, and/or memory 872 and processing unit 860 may be configured to execute one or more aspects of process discussed above in connection with FIGS. 1-7.

Secondary memory 826 and/or 866 may include, for example, the same or similar type of memory as primary memory or one or more storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 840. Computer-readable medium 840 may include, for example, any non-transitory medium that can carry or make accessible data, code or instructions for one or more of the devices in system 800. Computer-readable medium 840 may also be referred to as a storage medium.

First device 802 may include a communication interface 830 and second device 804 may include a communication interface 870 that provide for or otherwise supports an operative coupling of first device 802 and second device 804 at least through antennas 808 and 848. By way of example but not limitation, communication interface 830 and/or 870 may include a network interface device or card, a modem, a router, a switch, a transceiver, and the like. In other alternative implementations, communication interface 830 and/or 870 may comprise a wired/LAN interface, wireless LAN interface (e.g., IEEE std. 802.11 wireless interface) and/or a wide area network (WAN) air interface. In a particular implementation, communication interface 830 and/or 870 may include circuitry to enable an exchange of messages according to one or more signal messaging formats set forth in one or more ISO/IEC 18000 conventions. In a particular implementation, antenna 808 in combination with communication interface 830, and antenna 848 in combination with communication interface 870 may be used to implement transmission and reception of signals as illustrated in FIGS. 1-7.

According to an embodiment, second device 804 may further comprise sensors 891 which may comprise, for example, a light sensor and/or temperature sensor (e.g., embedded in a smart food label) capable of generating signals representative of measurements and/or observations of particular conditions. In addition, second device 804 may comprise display label 873 to display values computed at processing unit 860. Display label 873 may comprise, for example, via printed e-ink display. Such values displayed on and/or through display label 873 may comprise values computed at processing unit 860 based, at least in part, on signals representative of measurements and/or observations obtained from sensors 891. Second device 804 may also comprise circuitry and/or structures (not shown) for collecting and/or harvesting energy and/or power from a signal received at antenna 848. As pointed out above, such energy collected and/or harvested from a signal received at antenna 848 may be used for powering subsystems of second device 804. Such subsystems of second device 804 may include, for example, communication interface 870, time reference unit 890, sensors 891, processing unit 860, label display 873 and/or memory 872. It should be understood, however, that these are merely examples of subsystems of a device that may be powered based, at least in part, from energy harvested and/or collected from an RF signal received at an antenna, and claimed subject matter is not limited in this respect.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. It is noted, however, that a SIM card may also be electronic, meaning that is may simply be stored in a particular location in memory of the computing and/or networking device. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of email, short message service (SMS), and/or multimedia message service (MMS), including via a network, such as a social network, formed at least in part by a portion of a computing and/or communications network, including, but not limited to, Facebook, LinkedIn, Twitter, and/or Flickr, to provide only a few examples. A computing and/or network device may also include executable computer instructions to process and/or communicate digital content, such as, for example, textual content, digital multimedia content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

In FIG. 8, first device 802 and/or second device 804 may provide one or more sources of executable computer instructions in the form physical states and/or signals (e.g., stored in memory states), for example. First device 802 may communicate with second device 804 by way of a network connection, such as by uplink and downlink signals, for example. As previously mentioned, a connection, while physical, may not necessarily be tangible. Although first and second devices 802 and 804 of FIG. 8 show various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 822 and/or 872 may comprise any non-transitory storage mechanism. Memory 822/872 may comprise, for example, primary memory 824/864 and secondary memory 826/866, additional memory circuits, mechanisms, or combinations thereof may be used. Memory 822 and/or memory 872 may comprise, for example, random access memory, non-volatile memory, read only memory, etc., such as in the form of one or more storage devices and/or systems, such as, for example, a disk drive including an optical disc drive, a tape drive, a solid-state memory drive, etc., just to name a few examples.

Memory 822 and/or 872 may be utilized to store a program of executable computer instructions. For example, processor 820 and/or processor 860 may fetch executable instructions from memory and proceed to execute the fetched instructions. Memory 822 may also comprise a memory controller for accessing device readable-medium 840 that may carry and/or make accessible digital content, which may include code, and/or instructions, for example, executable by processor 820 and/or some other device, such as a controller, as one example, capable of executing computer instructions, for example. Under direction of processor 820, a non-transitory memory, such as memory cells storing physical states (e.g., memory states), comprising, for example, a program of executable computer instructions, may be executed by processor 820 and able to generate signals to be communicated via a network, for example, as previously described. Generated signals may also be stored in memory, also previously suggested.

Memory 822 may store electronic files and/or electronic documents, such as relating to one or more users, and may also comprise a computer-readable medium that may carry and/or make accessible content, including code and/or instructions, for example, executable by processor 820 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present patent application, and generally, is considered to be a self-consistent sequence of operations and/or similar signal processing leading to a desired result. In the context of the present patent application, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular patent application, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 8, processor 820 and/or 860 may comprise one or more circuits, such as digital circuits, to perform at least a portion of a computing procedure and/or process. By way of example, but not limitation, processor 820 and/or 860 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 820 and/or 860 may perform signal processing, typically substantially in accordance with fetched executable computer instructions, such as to manipulate signals and/or states, to construct signals and/or states, etc., with signals and/or states generated in such a manner to be communicated and/or stored in memory, for example.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. An apparatus, comprising:
energy harvesting circuitry of an energy harvested device;
at least one processor of the energy harvested device to be powered at least in part by the energy harvesting circuitry; and
testing circuitry coupled to the at least one processor, wherein the testing circuitry comprises a battery and a test controller, wherein the test controller is powered at least in part via the battery, wherein the test controller automatically initiates testing of one or more workloads to be executed at least in part by the at least one processor under one or more particular energy scenarios, and wherein the testing circuitry further comprises a real time clock powered at least in part via the battery, wherein the testing circuitry becomes energized by the battery a specified period of time after deployment as determined at least in part via the real time clock;
wherein the energy harvesting circuitry, the at least one processor and the testing circuitry are implemented on a particular integrated circuit die.

2. The apparatus of claim 1, wherein the test controller performs one or more routines to emulate the one or more respective energy scenarios.

3. The apparatus of claim 2, wherein the testing circuitry further comprises a wireless communication interface to receive one or more wireless signals and/or signal packets representative of the one or more routines to emulate the one or more respective energy scenarios, and wherein the test controller further initiates communication of signals and/or signal packets representative of one or more test results to an external computing device via the wireless communication interface.

4. The apparatus of claim 2, wherein the one or more routines signal one or more interrupts to the at least one processor, wherein the one or more interrupts indicate one or more events or conditions, or a combination thereof.

5. The apparatus of claim 1, wherein the testing circuitry further comprises environmental logging circuitry or harvested voltage sampling circuitry, or a combination thereof.

6. The apparatus of claim 5, further comprising one or more antennas, wherein the environmental logging circuitry or the test controller, or a combination thereof, detects or logs, or a combination thereof, one or more particular radio-frequency commands received at the one or more antennas.

7. The apparatus of claim 1, further comprising one or more switch circuits coupled between the testing circuitry and the energy harvesting circuitry, wherein the test controller initiates opening of the one or more switch circuits responsive at least in part to a voltage measured at the battery falling below a specified threshold voltage level, wherein the one or more switch circuits are opened at least in part via application of power provided at least in part by the battery.

8. A method, comprising:
harvesting energy from one or more wireless signals via an energy harvesting circuit;
applying harvested energy from the energy harvesting circuit to at least one processor; and
testing the at least one processor via testing circuitry coupled to the at least one processor, wherein the testing circuitry comprises a battery and a test controller, wherein the test controller is powered at least in part via the battery, and wherein the testing the at least one processor includes automatically initiating testing of one or more workloads under one or more particular energy scenarios, wherein the testing the at least one processor includes energizing the testing circuitry via the battery a specified period of time after deployment as determined at least in part via a real time clock;
wherein the energy harvesting circuit, the at least one processor and the testing circuitry are implemented on a particular integrated circuit die.

9. The method of claim 8, wherein the testing the at least one processor includes performing, at least in part via the test controller, one or more routines to emulate the one or more respective energy scenarios.

10. The method of claim 9, further comprising:
receiving, via a wireless communication interface implemented on the particular integrated circuit die, one or more wireless signals and/or signal packets representative of the one or more routines to emulate the one or more respective energy scenarios; and
initiating, at least in part via the test controller, communication of signals and/or signal packets representative of one or more test results to an external computing device via the wireless communication interface.

11. The method of claim 9, wherein the performing the one or more routines includes signaling one or more interrupts to the at least one processor, wherein the one or more interrupts indicate one or more power on, power off, sleep, shutdown, low voltage detected or voltage increase detected modes of operation, or a combination thereof.

12. The method of claim 8, wherein the one or more wireless signals comprise one or more radio-frequency signals, and wherein the method further comprises detecting or logging, or a combination thereof, one or more attacks including detecting or logging, or a combination thereof, the one or more radio-frequency signals at particular specified frequencies, frequency sweeps, non-implemented commands or specified queries, or a combination thereof.

13. The method of claim 8, further comprising initiating opening one or more switch circuits coupled between the testing circuitry and the energy harvesting circuit responsive at least in part to a voltage measured at the battery falling below a specified threshold voltage level, wherein the one or more switch circuits are opened at least in part via application of power provided at least in part by the battery.

14. The method of claim 8, further comprising recharging the battery via the one or more wireless signals received at one or more antennas.

15. The method of claim 14, wherein the one or more wireless signals comprise one or more radio-frequency signals, wherein the one or more antennas comprise at least a first antenna to receive radio-frequency signals at a first particular frequency and at least a second antenna to receive radio-frequency signals at a second particular frequency, wherein the at least the first antenna is associated with energy-harvested domain circuitry including the at least one processor and wherein the at least the second antenna is associated with battery-assisted domain circuitry including the testing circuitry, and further wherein the recharging the battery comprises recharging the battery via the one or more radio-frequency signals received via the at least the second antenna at the second particular frequency.

* * * * *